United States Patent [19]
Zook et al.

[11] Patent Number: 5,473,620
[45] Date of Patent: Dec. 5, 1995

[54] PROGRAMMABLE REDUNDANCY/SYNDROME GENERATOR

[75] Inventors: Christopher P. Zook, Boulder; Neal Glover, Broomfield, both of Colo.

[73] Assignee: Cirrus Logic, Inc., Fremont, Calif.

[21] Appl. No.: 124,938

[22] Filed: Sep. 21, 1993

[51] Int. Cl.[6] .................................................. H03M 13/00
[52] U.S. Cl. .................................. 371/37.1; 371/37.5
[58] Field of Search ................................. 371/37.1, 37.4, 371/37.5

[56] References Cited

U.S. PATENT DOCUMENTS 4,777,635  10/1988  Glover ................................. 371/37.5
4,782,490  11/1988  Tenengolts ........................... 371/37.5
5,107,503   4/1992  Riggle et al. ........................ 371/37.1

OTHER PUBLICATIONS

Specification for the OSI EDAC Part, Data Systems Technology Corp., Aug. 16, 1988, pp. 1–3, & figures.

*Primary Examiner*—Paul P. Gordon
*Attorney, Agent, or Firm*—Blakely, Sokoloff, Taylor and Zafman

[57] ABSTRACT

An apparatus and method of generating redundancy symbols and syndromes which is order-programmable is disclosed. The apparatus and method involves the implementation of an error correcting encoder/decoder for polynomial codes which uses a single circuit to generate check symbols during the transmit operation and to generate syndromes during a receive operation. The selection of roots for the code generator, and hence, the code order is programmable.

29 Claims, 6 Drawing Sheets

PROGRAMMABLE REDUNDANCY/SYNDROME GENERATOR

FIELD OF THE INVENTION

This invention relates generally to digital data communication systems, particularly to the encoding and decoding of error correcting codes.

BACKGROUND OF THE INVENTION

In a digital data communication system (including storage and retrieval from optical or magnetic media) in order to increase the transfer rate of information and at the same time make the error rate arbitrarily low, it is necessary to employ an error control system. For fixed signal-to-noise ratios and fixed bandwidths, improvements can be made through the use of error-correcting codes.

With error-correction coding the data to be transmitted or stored is mathematically processed to obtain additional data symbols called check symbols or redundancy symbols. The data and check symbols together make up a codeword. After transmission or retrieval the codeword is mathematically processed to obtain error syndromes which contain information about locations and values of errors.

For many error-correcting codes (e.g. polynomial codes such as, but not limited to, Reed-Solomon codes) the codewords are formed by appending a remainder polynomial (redundancy symbols) to a data polynomial so as to make the composite polynomial divisible by a generator polynomial. The remainder polynomial is obtained by dividing the data polynomial by the generator polynomial and keeping the remainder polynomial. The error syndromes are obtained by dividing the received polynomial (a codeword polynomial which may have an error polynomial added to it) by the individual factors of the generator polynomial.

PRIOR ART

FIG. 1 shows a circuit which can generate redundancy symbols by performing polynomial division.

FIG. 2 shows a plurality of first-order dividers in which each can generate one of the error syndromes.

PRIOR ART LIMITATIONS

One problem arising in the use of these codes is the significant amount of circuitry needed in high-speed implementations of high-order (capable of correcting many errors) generators for the redundancy symbols and the error syndromes. For systems which require the ability to do both the encoding and decoding, albeit not simultaneously, it is a desirable trait to have one circuit capable of generating both sets of symbols. It is also a desirable trait for the encoder to be programmable so as to be able to produce different order codes (codewords with different numbers of redundancy bytes). The usual method has neither of these traits.

U.S. Pat. No. 4,777,635 entitled "REED-SOLOMON CODE ENCODER and SYNDROME GENERATOR CIRCUIT" issued to Neal Glover discloses a circuit which can generate both redundancy and syndrome symbols but is not order-programmable.

The Berlekamp-Welch algorithm is a general decoding algorithm which does not use syndromes but instead uses the encoder circuit to compute a remainder from the received polynomial. However the algorithm is a bit more complicated than that which processes syndromes and it is not order-programmable. It is also possible to convert the remainder to syndromes but this requires significant additional circuitry.

SUMMARY OF THE INVENTION

It is an object of the present invention to decrease the size of the circuitry in a hardware implementation of an error correcting encoder/decoder by using a single circuit to generate check symbols during the transmit operation and to also generate syndromes during a receive operation.

Another object is to decrease the size of the circuitry in a hardware implementation of an error correcting encoder/decoder by using a single circuit to generate check symbols for codewords containing differing numbers of check symbols.

DETAILED DESCRIPTION OF THE INVENTION

This invention includes a method and apparatus capable of generating redundancy symbols and syndromes and is order-programmable. The theory of operation of this invention is as follows: Polynomial codes consist of codewords which are multiples of a generator polynomial. A codeword, $c(x)$, is formed by dividing a data polynomial, $D(x)$, of degree less than k by a generator polynomial, $g(x)$ of degree n-k to obtain a redundancy polynomial, $r(x)$, of degree less than n-k. Appending $r(x)$ to $D(x)$ yields $c(x)$ of degree less than n (i.e. there are k data symbols and n-k redundancy symbols and n total symbols, each symbol having a predetermined plurality of bits m).

$$g(x) = \prod_{j=0}^{n-k-1} (x + r_j)$$

$$r(x) = D(x) \times x^{n-k} \bmod(g(x))$$

$$c(x) = D(x) \times x^{n-k} + r(x)$$

The following explanation will show that it is possible to feed $D(x)$ into a cascade of first-order dividers (where each divider divides by one factor, $(x+r_j)$) to generate $r(x)$. These first order dividers can then be used to generate syndromes during read-operations (decoding).

Figure 1:
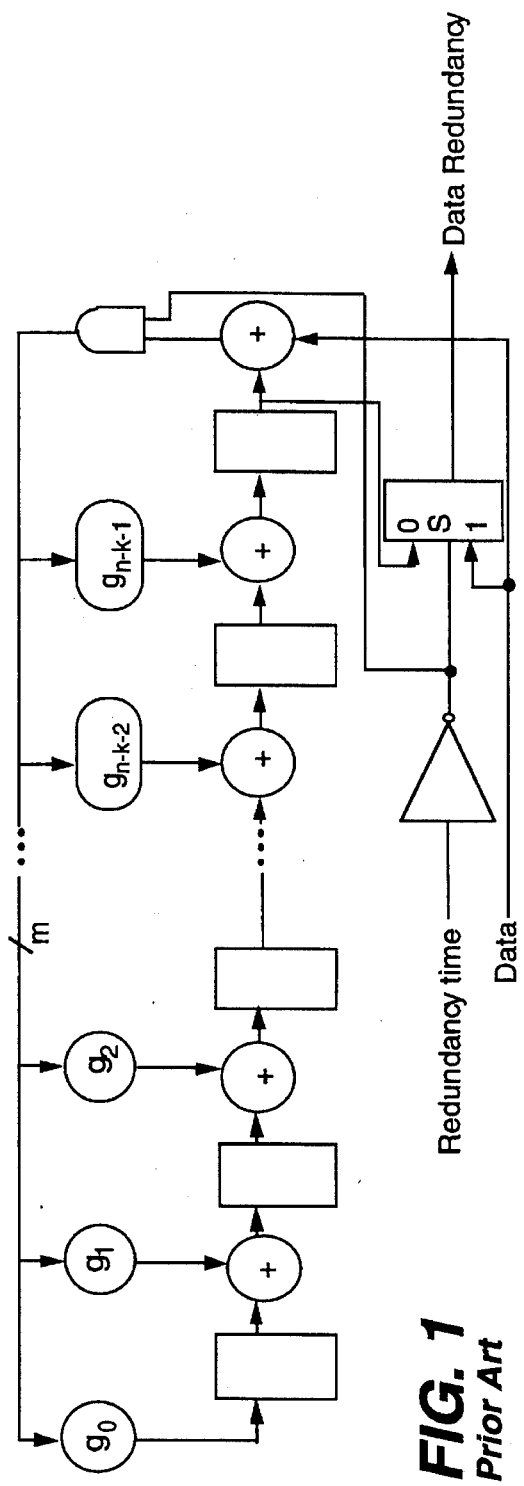
FIG. 1 shows the prior-art solution for generating redundancy symbols.
Figure 2:
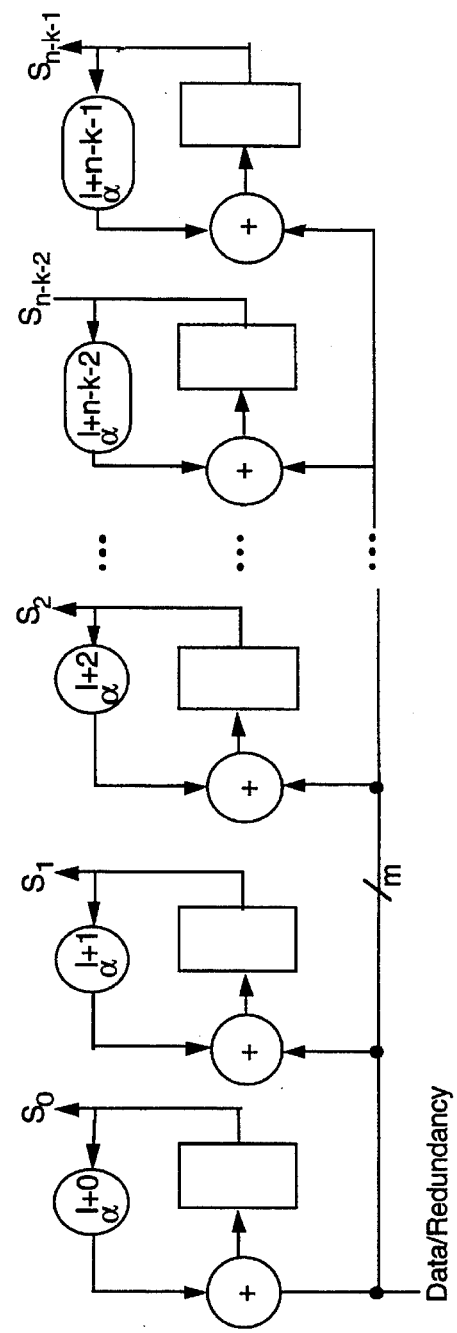
FIG. 2 shows the prior-art solution for generating syndromes.
Figure 3:
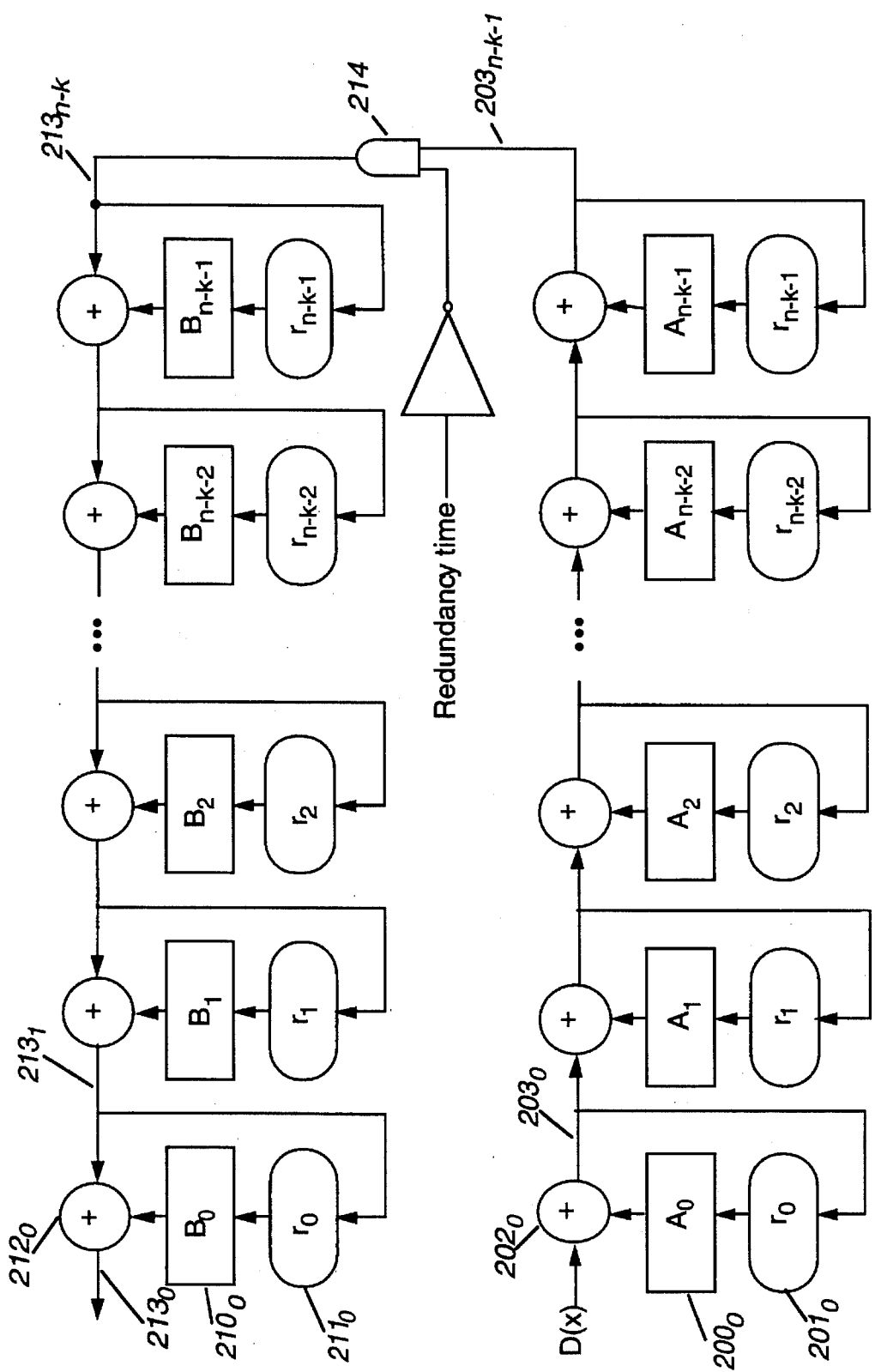
FIG. 3 illustrates the basic principle utilized in the present invention.

FIG. 3 shows a plurality of cells, where each cell comprises a resettable register $200_j$ or $210_j$, an adder $202_j$ or $212_j$, and a constant multiplier $201_j$ or $211_j$, where j=0, 1, 2, ..., n-k-2, n-k-1. Each of the cells may be configured to operate as a polynomial divider (where register $200_j$ is implemented) or a polynomial multiplier (where register $210_j$ is implemented), as discussed in greater detail below. In one embodiment, the resettable register $200_j$ or $210_j$, adder $202_j$ or $212_j$, and constant multiplier $201_j$ or $211_j$ are each m bit wide.

FIG. 3 shows a cascade of first-order polynomial dividers followed by a cascade of first-order polynomial multipliers. Each polynomial divider is made of a registear $(A_j)$ $200_j$, a constant multiplier $(r_j)$ $201_j$ and adder $202_j$, each one symbol wide, where again, j ranges from 0 to n–k–1, where j=0, 1, 2, ..., n–k–2, n–k–1. The output of each polynomial divider is the input polynomial multiplied by x and divided by $(x+r_j)$. Each polynomial divider is made of a register $(B_j)$ $210_j$, a constant divider $(r_j)$ $211_j$ and an adder $212_j$, each one symbol wide, where j=0, 1, 2, ..., n–k–2, n–k–1. The input to each divider is $213_t$, where t=0, 1, ..., $213_{n-k}$. Each polynomial multiplier is made of a register $210_j$, a constant multiplier $211_j$ and an adder $212_j$, and multiplies its input by $(x+r_j)$. At each step of operation (simultaneous clocking of all registers and inputting a further symbol) the output of each divider matches the input to the corresponding multiplier, e.g. $203_0$ matches $213_1$. Also each divider register matches the corresponding multiplier register, e.g. $A_j$ matches $B_j$. The output of divider cascade $203_{n-k-1}$ is:

$$203_{n-k-1} = \frac{x^{n-k}D(x)}{\prod_{j=0}^{n-k-1}(x+r_j)} = \frac{x^{n-k}D(x)}{g(x)} = q(x)$$

And $$x^{n-k}D(x) - q(x) \times g(x) = x^{n-k}D(x) \bmod(g(x))$$

Therefore $$q(x) = \frac{x^{n-k}D(x) - x^{n-k}D(x)\bmod(g(x))}{g(x)}$$

The output of the multiplier cascade is q(x) g(x). The first k terms (symbols) appearing on $203_{n-k-1}$ is q(x) and the first k terms (symbols) appearing on $213_0$ is D(x). To obtain the rest of q(x) g(x), the input to the multiplier cascade is set to zero by the gate 214 and the circuit is clocked n–k more times. During these clocks the output of the multiplier cascade, $213_0$, is $x^{n-k}D(x) \bmod g(x)$, which is the series of redundancy symbols in a polynomial code.

IMPLEMENTATION

Figure 4:
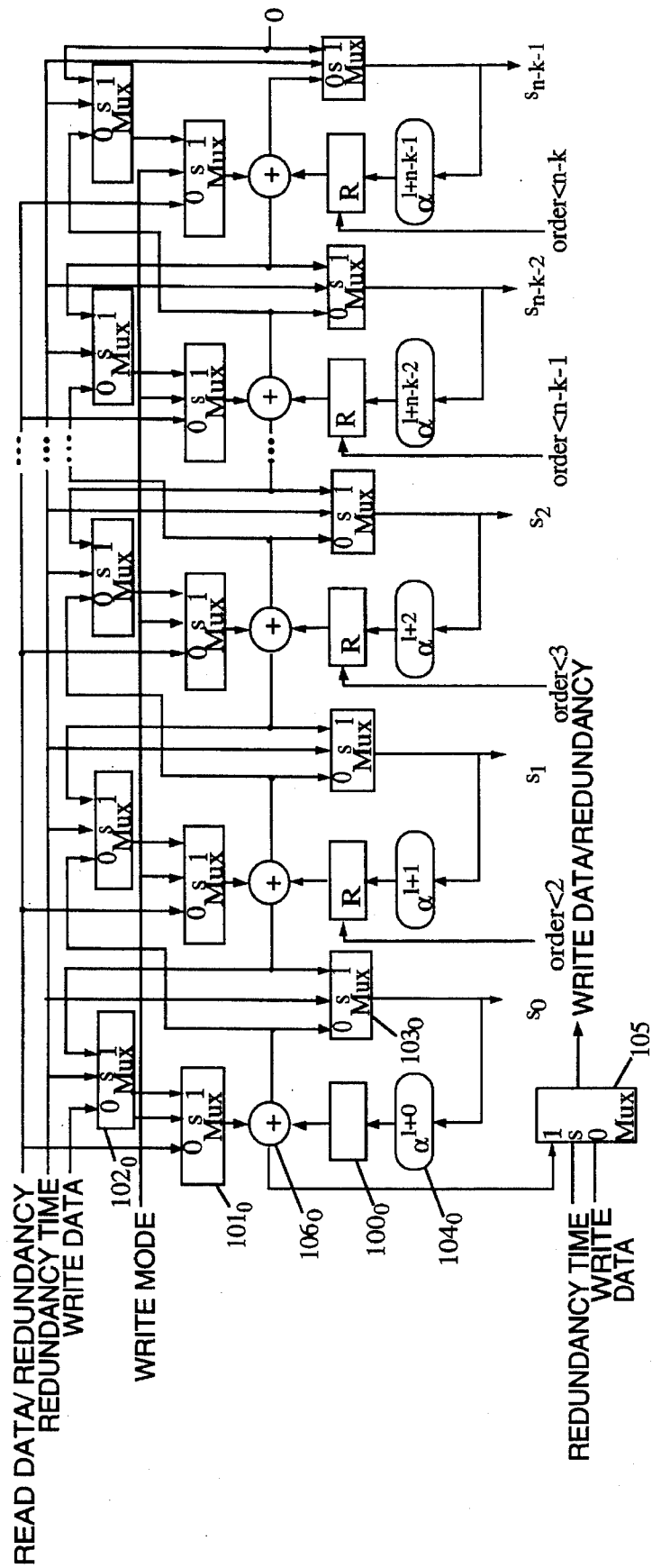
FIG. 4 shows a block diagram of the preferred embodiment of the present invention.

Since the multiplier registers in FIG. 3 always match the divider registers, the multiplier cascade can be discarded and during the last n–k clocks the divider can be connected as a multiplier cascade to yield the redundancy symbols. This is illustrated in FIG. 4. Then when REDUNDANCY TIME is OFF the MUXes $102_j$ and $103_j$, where j=0, 1, 2, ..., n–k–2, n–k–1, cause the registers and constant multipliers to be connected so as to form a cascade of dividers from left to right (the adders $106_j$, where j=0, 1, 2, n–k–2, n–k–1 add from left to right). When REDUNDANCY TIME is ON the MUXes $102_j$ and $103_j$ cause the registers and constant multipliers to be connected so as to form a cascade of multipliers from right to left (the adders add from right to left). The function of the MUXes $101_j$ is to form separate dividers (not in a cascade) for syndrome generation.

During a write-operation (encoding) WRITE MODE is ON. For the first k clock times REDUNDANCY TIME is OFF and the input data bytes are passed through to the output of MUX 105. For the last n–k clock times REDUNDANCY TIME is ON and the redundancy symbols are present at the output of MUX 105.

During a read-operation WRITE MODE is OFF and REDUNDANCY TIME is OFF and the entire received polynomial consisting of data and redundancy is input for n clock times. During the last clock time the syndromes are available on the output of MUXes 103.

By holding the reset input to a register ON during redundancy generation the corresponding root for that register is left out of the redundancy computation. This allows the selection of roots to be entirely programmable, and in particular it allows the number of roots (code order) to be programmable.

The generator shown in FIG. 4 is for a Reed-Solomon code (i.e. the roots as shown in the constant multipliers $104_j$ are consecutive powers of alpha, a primitive root of the field). However the invention applies to any polynomial code with any selection of roots. The resets to the registers 100 are "ORDER<j", which is the selection criterion for Reed-Solomon codes (i.e. ORDER consecutive roots are included and the remainder are left out, where ORDER is the number of roots in the generator). However any selection criterion may be used.

Figure 5:
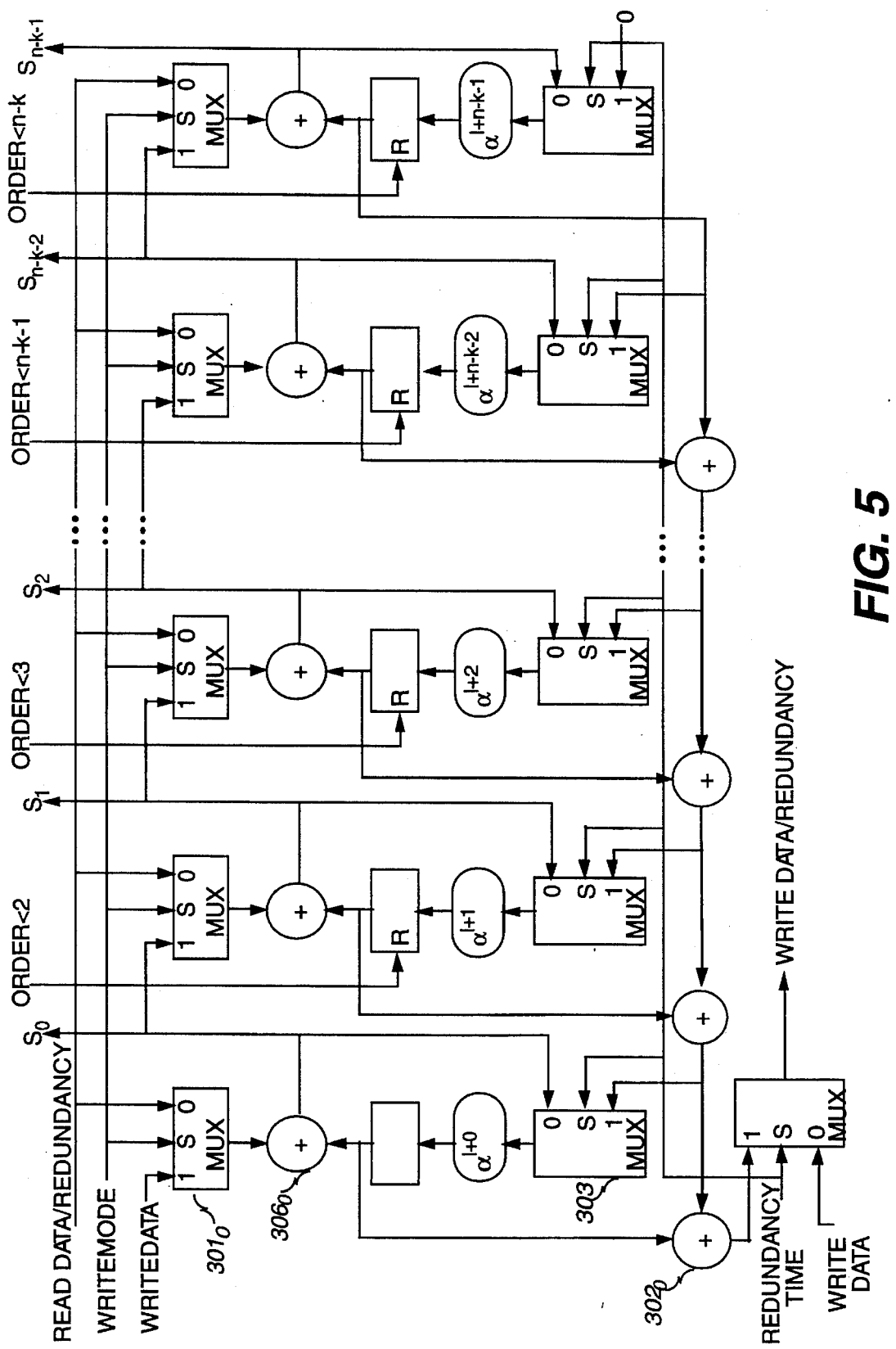
FIG. 5 shows a block diagram of an alternate embodiment of the present invention.

FIG. 5 shows an alternate implementation in which one set of MUXes is removed from the adder chain of FIG. 4 and a second adder chain is added. The upper adder chain $306_j$ only adds from left to right (for data time) and the lower adder chain $302_j$ only adds from right to left (for redundancy time). This allows faster operation at the expense of more gates (trading MUXes for adders). MUXes $303_j$ switch between having a divider cascade for data time or having a multiplier cascade for redundancy time. MUXes $301_j$ switch between having a cascade of dividers/multipliers for encoding and having separate dividers for syndrome generation.

Figure 6:
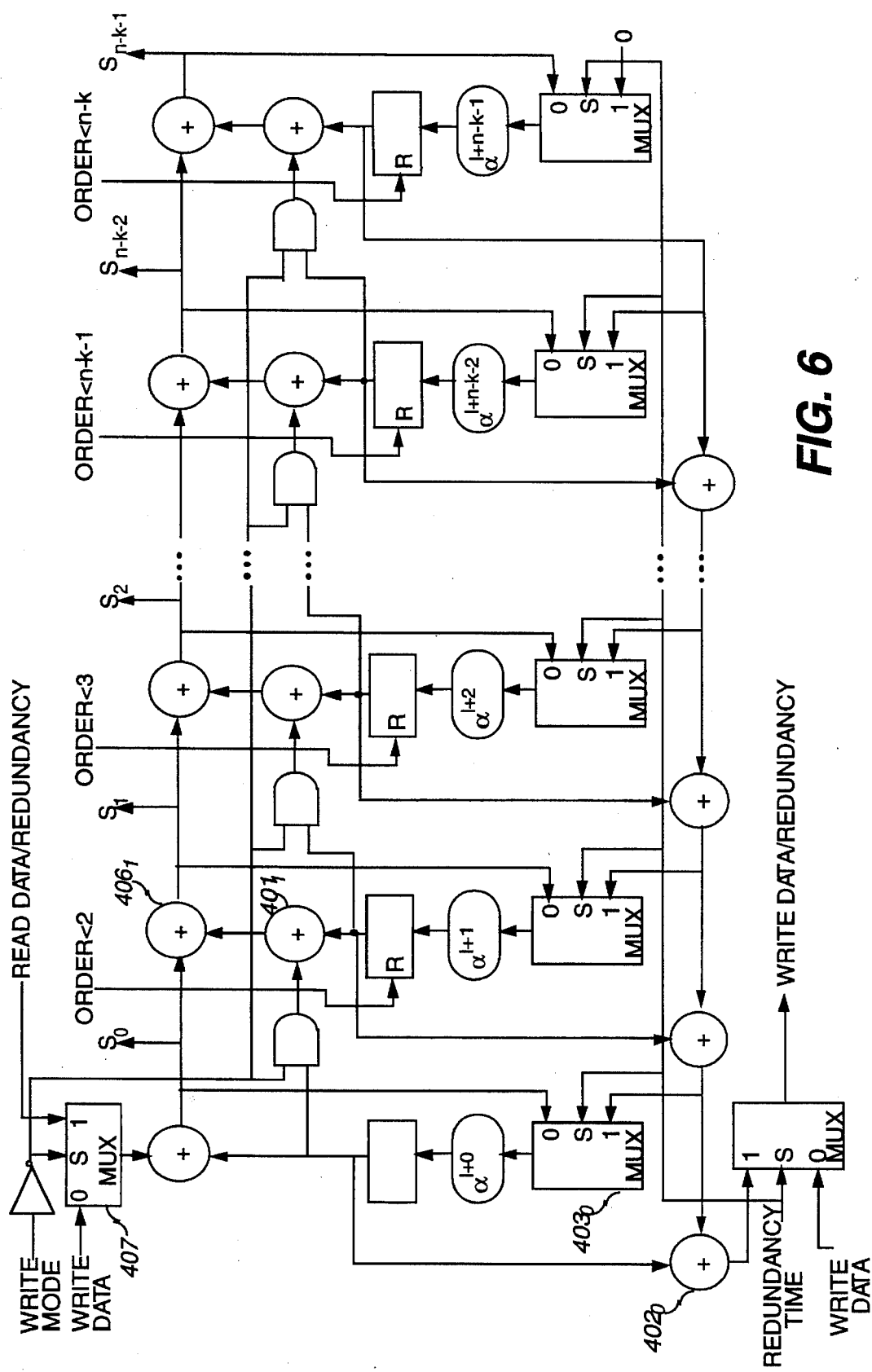
FIG. 6 shows a block diagram of a further alternate embodiment of the present invention.

FIG. 6 shows an alternate implementation in which the set of MUXes is removed from the upper adder chain in FIG. 5 and its function of allowing syndrome generation is performed by including the set of adders $401_p$, where p=1, 2, ..., n–k–2, n–k–1, and MUX 407. The lower adder chain 402 and MUXes 403 remain the same as the lower adder chain 302 and MUXes 303 of FIG. 5. During read mode, MUX 407 allows read data to be the input and adder chain $401_p$ is enabled which causes the register output for each stage to be added to the next stage twice through adders $401_p$ and $406_p$. This effectively decouples each stage, since in the finite field of $GF(2^m)$, adding an element to itself results in zero. This allows for the fastest operation, at the expense of more gates (trading MUXes for adders), as the adder chain $406_p$ no longer contains any MUXes. The lower adder chain $402_u$, where u=0, 1, 2, ..., n–k–2, corresponds to the lower adder chain $302_j$ and functions in a similar manner.

Figure 7:
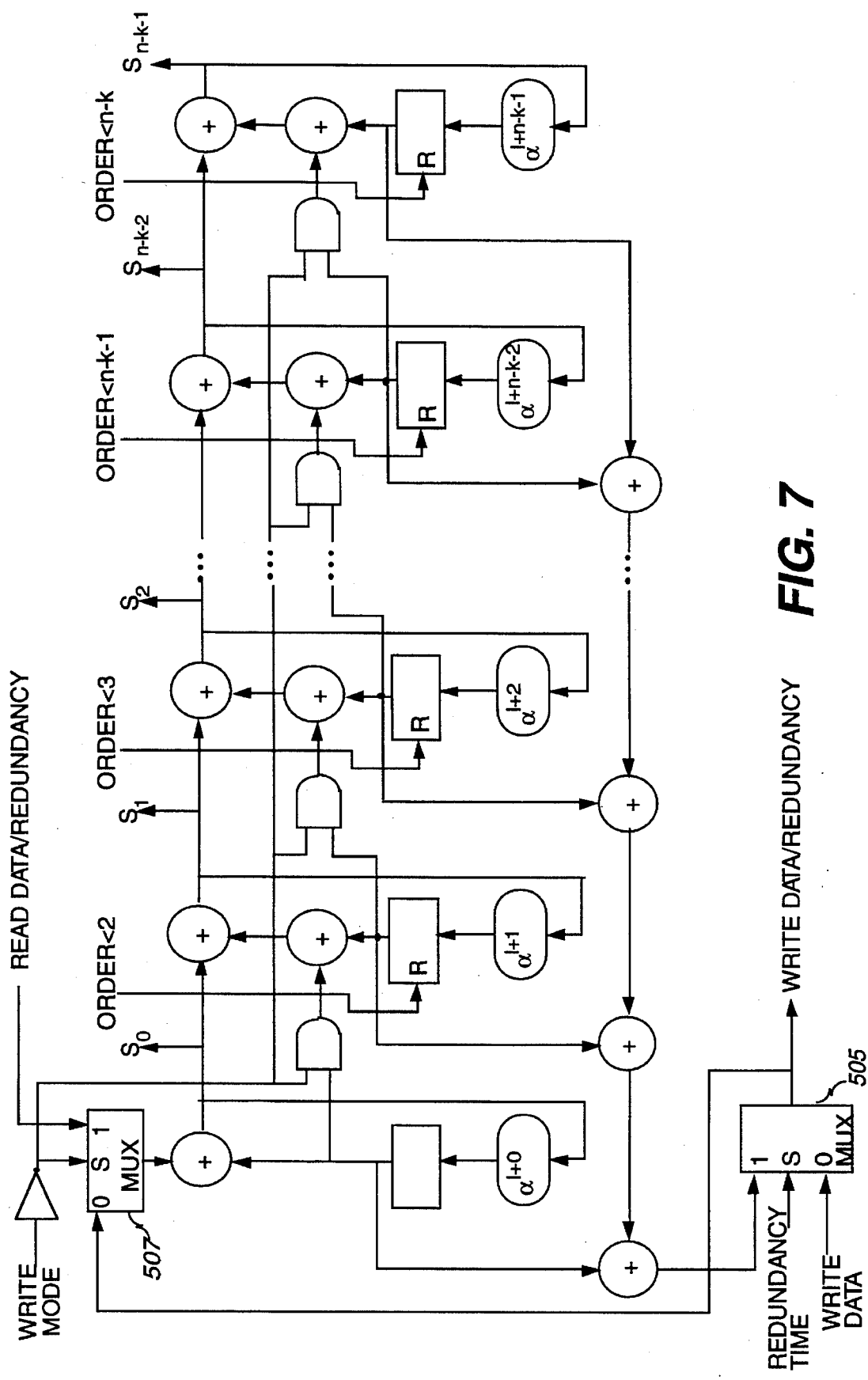
FIG. 7 shows a block diagram of a still further alternate embodiment of the present invention.

FIG. 7 shows an alternate implementation in which the MUXes in FIG. 6 have been eliminated. The sections remain in the divider configuration during redundancy time but the input switches from data to redundancy through MUXes 505 and 507. Because of the cancellation that occurs when elements are added to themselves, adding the output of the lower adder chain, which is equal to the sum of the contents of the registers, to the input of the upper adder chain, has the same function and result as actually changing the configuration from left-to-right dividers to right-to-left multipliers as in the other implementations.

While the preferred embodiment and various alternative embodiments of the invention have been disclosed and described in detail herein, it will be obvious to those skilled in the art that various changes in form and detail may be made therein without departing from the spirit and scope thereof.

We claim:

1. Apparatus for generating redundancy symbols during encoding of data comprising groups of binary bits into codewords of polynomial codes, each codeword having data and redundancy symbols, each symbol having a predetermined plurality of binary bits, and for generating syndromes during decoding of corresponding codewords which may contain errors, comprising:

(a) cell set means where each cell comprises:
   a resettable register,
   an adder, and
   a constant multiplier;

(b) first connection means enabling each said cell to be connected as a first-order polynomial divider having a current output and a current input, in which the current output is the current input added to the output of a register in said divider, the register having an input comprising the current output multiplied by a constant;

(c) second connection means enabling each said cell to be connected as a first-order polynomial multiplier having a current output and a current input, in which the current output is the current input added to the output of a register in said multiplier, the register having an input comprising the current input multiplied by a constant;

(d) said first and said second connection means enabling said cell set to be connected either as a cascade of said first-order polynomial dividers or a cascade of said first-order polynomial multipliers;

(e) third connection means enabling transmittal data to be connected to an input stage of the divider cascade;

(f) fourth connection means enabling the output of an output stage of the multiplier cascade to be output to an information channel as the codeword redundancy symbols; and, (g) fifth connection means enabling each said cell to be connected as separate first-order polynomial dividers so that each said divider may be used to divide received data in order to generate one of the syndromes.

2. The apparatus of claim 1 wherein the constant multiplier of each cell multiplies its input by one of the roots of a generator polynomial.

3. The apparatus of claim 1 wherein the register of a cell is held reset when the root of the cell is not to be included in the desired generator polynomial.

4. Apparatus for generating redundancy symbols during encoding of data comprising groups of binary bits into codewords of polynomial codes, each codeword c(x) being formed by dividing a data polynomial D(x) of degree less than k by a generator polynomial g(x) of degree n-k to obtain a redundancy polynomial r(x) of degree less than n-k, and appending r(x) to D(x) to yield c(x) of degree less than n, each symbol having a predetermined plurality of binary bits m, and for generating syndromes during decoding of codewords which may contain errors, comprising:

(a) a plurality of cells, each cell having;
   an m bit wide adder having first and second adder inputs and an output;
   an m bit wide resettable register having its output connected as one input to said adder;
   an m bit wide finite field constant multiplier having its output connected to said resettable register;

(b) connection means for selectively connecting each said cell as a first-order polynomial divider having a current output and a current input, in which the current output of each said m bit wide adder is the current input to the respective said cell added to the output of the respective said register in said divider, the register having an input comprising the current output of the respective said adder multiplied by a finite field constant;

(c) connection means for selectively connecting each said cell as a first-order polynomial multiplier having a current output and a current input, in which the current output is the current input added to the output of a register in said multiplier, the register having an input comprising the current input multiplied by a constant, said cells being ordered in a cascade of first-order polynomial multipliers in opposite order from their respective order in the cascade of first-order polynomial dividers:

(d) connection means for selectively connecting said plurality of cells either as a cascade of said first-order polynomial dividers or a cascade of said first-order polynomial multipliers;

(e) connection means enabling transmittal data to be connected to an input stage of the divider cascade;

(f) a connection means enabling the output of an output stage of the said multiplier cascade to be output to an information channel as the redundancy symbols; and, (g) a connection means enabling each said cell to be connected as separate first-order polynomial dividers so that each said divider may be used to divide received data in order to generate one of the syndromes.

5. The apparatus of claim 4 wherein the constant multiplier of each cell multiplies its input by one of the possible roots of a possible generator polynomial.

6. The apparatus of claim 4 wherein the register of a cell is held reset when the root of the cell is not to be included in the desired generator polynomial.

7. Apparatus for generating redundancy symbols during encoding of data symbols consisting of groups of binary bits into codewords of polynomial codes, each codeword c(x) being formed by dividing a data polynomial D(x) of degree less than k by a generator polynomial g(x) of degree n-k to obtain a redundancy polynomial r(x) of degree less than n-k, and appending r(x) to D(x) to yield c(x) of degree less than n, each symbol having a predetermined plurality of binary bits m, comprising:

a plurality of cells, each cell having a register, a finite field multiplier and an adder, each cell being selectively connectable as a first order polynomial divider and as a first order polynomial multiplier;

means for connecting each cell to form a first order polynomial divider, and for coupling said first order polynomial dividers together to form a cascade of first order polynomial dividers;

means for sequentially inputting data symbols for a codeword to the cascade of first-order polynomial dividers;

means for connecting each cell to form a first order polynomial multiplier, and for coupling said first order polynomial multipliers together to form a cascade of first order polynomial multipliers, said registers being ordered in said cascade of first-order polynomial multipliers in opposite order from their respective order in the cascade of first-order polynomial dividers; and, means for holding the input to said multiplier cascade to zero and clocking said registers to clock out the redundancy symbols associated with the data symbols.

8. Apparatus for generating redundancy symbols during encoding of data symbols and for generating syndromes during decoding of codewords which may contain errors comprising the apparatus of claim 7 and further comprising:

means for connecting each cell to form a separate first order polynomial divider; and, means for providing codewords that may have errors therein to the separate dividers to divide the received codeword by the generating polynomial to generate one of the syndromes.

9. The apparatus of claim 7 wherein the register of a cell is held reset when the root of the cell is not to be included in the desired generator polynomial.

10. A method of generating redundancy symbols during encoding of data symbols consisting of groups of binary bits into codewords of polynomial codes, each codeword $c(x)$ being formed by dividing a data polynomial $D(x)$ of degree less than k by a generator polynomial $g(x)$ of degree n-k to obtain a redundancy polynomial $r(x)$ of degree less than n-k, and appending $r(x)$ to $D(x)$ to yield $c(x)$ of degree less than n, each symbol having a predetermined plurality of binary bits m, comprising the steps of:

(a) providing a plurality of cells, each cell having:
an m bit wide resettable register, each register having a register input and a register output,
an m bit wide finite field constant multiplier having a multiplier input and a multiplier output connected to said register input;

(b) connecting the register output of each of the plurality of cells as one of two adder inputs of a respective m bit wide adder, and connecting the input of said m bit wide finite field constant multiplier so that the current output of each said m bit wide adder is the current input to the respective said adder added to the output of the respective said register whose input is the current output of the respective said adder multiplied by a finite field constant to form a first order polynomial divider, and coupling said first order polynomial dividers together to form a cascade of first order polynomial dividers;

(c) sequentially inputting data symbols for a codeword to the cascade of first-order polynomial dividers formed in step (b);

(d) connecting the register output of each of the plurality of cells as one of two adder inputs of a respective m bit wide adder, and connecting the input of said m bit wide finite field constant multiplier so that the current output of each of the last named said m bit wide adders is the current input to the respective said adder added to the output of the respective said register whose input is the current output of the respective said adder multiplied by a finite field constant to form a first order polynomial multiplier, and coupling said first order polynomial multipliers together to form a cascade of first order polynomial multipliers, said cells formed by the resettable registers and respective finite field multipliers being ordered in said cascade of first-order polynomial multipliers in opposite order from their respective order in the cascade of first-order polynomial dividers; and, (e) holding the input to said multiplier cascade to zero and clocking said resettable registers to clock out the redundancy symbols associated with the data symbols of step (c).

11. The method of generating redundancy symbols during encoding of data symbols and for generating syndromes during decoding of codewords which may contain errors comprising the steps of claim 10 and further comprising the steps of:

(f) connecting each cell to an m bit wide adder, each cell forming a separate first order polynomial divider; and, (g) providing codewords that may have errors therein to the dividers of step (f) to divide the received code word by the generating polynomial to generate the syndromes.

12. The method of claim 10 wherein the adders used in step (d) are the same adders as used in step (b).

13. The method of claim 10 wherein the adders used in step (d) are different than the adders used in step (b).

14. The method of generating redundancy symbols during encoding of data symbols and for generating syndromes during decoding of codewords which may contain errors comprising the steps of claim 10 and further comprising the steps of:

(f) connecting each cell to a pair of m bit wide adders so that the output of each cell is added to the input to the next cell twice, each cell forming a separate first order polynomial divider; and, (g) providing codewords that may have errors therein to the dividers of step (f) to divide the received code word by the generating polynomial to generate the syndromes.

15. The method of claim 10 wherein the resettable register of a cell is held reset when the root of the cell is not to be included in the desired generator polynomial.

16. A method of generating redundancy symbols during encoding of data symbols consisting of groups of binary bits into codewords of polynomial codes, each codeword $c(x)$ being formed by dividing a data polynomial $D(x)$ of degree less than k by a generator polynomial $g(x)$ of degree n-k to obtain a redundancy polynomial $r(x)$ of degree less than n-k, and appending $r(x)$ to $D(x)$ to yield $c(x)$ of degree less than n, each symbol having a predetermined plurality of binary bits m, comprising the steps of:

(a) providing a plurality of cells, each cell having a register, a finite field multiplier and an adder, each cell being selectively connectable as a first order polynomial divider and as a first order polynomial multiplier;

(b) connecting each cell to form a first order polynomial divider, and coupling said first order polynomial dividers together to form a cascade of first order polynomial dividers;

(c) sequentially inputting data symbols for a codeword to the cascade of first-order polynomial dividers formed in step (b);

(d) connecting each cell to form a first order polynomial multiplier, and coupling said first order polynomial multipliers together to form a cascade of first order polynomial multipliers, said registers being ordered in said cascade of first-order polynomial multipliers in opposite order from their respective order in the cascade of first-order polynomial dividers; and, (e) holding the input to said multiplier cascade to zero and clocking said resettable registers to clock out the redundancy symbols associated with the data symbols of step (c).

17. The method of generating redundancy symbols during encoding of data symbols and for generating syndromes during decoding of codewords which may contain errors comprising the steps of claim 16 and further comprising the steps of:

(f) connecting each cell to an m bit wide adder, each cell forming a separate first order polynomial divider; and, (g) providing codewords that may have errors therein to the dividers of step (f) to divide the received code word by the generating polynomial to generate the syndromes.

18. The method of claim 16 wherein the adders used in step (d) are the same adders as used in step (b).

19. The method of claim 16 wherein the adders used in step (d) are different than the adders used in step (b).

20. The method of generating redundancy symbols during encoding of data symbols and for generating syndromes during decoding of codewords which may contain errors comprising the steps of claim 16 and further comprising the steps of:

(f) connecting each cell to a pair of m bit wide adders so that an output of each cell is added to an input to the next cell twice, each cell forming a separate first order polynomial divider; and, (g) providing codewords that may have errors therein to the dividers of step (f) to divide the received code word by the generating polynomial to generate the syndromes.

21. The method of claim 16 wherein the resettable register of a cell is held reset when the root of the cell is not to be included in the desired generator polynomial.

22. Apparatus for generating redundancy symbols during encoding of data symbols consisting of groups of binary bits into codewords of polynomial codes, each codeword c(x) being formed by dividing a data polynomial D(x) of degree less than k by a generator polynomial g(x) of degree n-k to obtain a redundancy polynomial r(x) of degree less than n-k, and appending r(x) to D(x) to yield c(x) of degree less than n, each symbol having a predetermined plurality of binary bits m, comprising:

a plurality of cells, each cell having a register, a finite field multiplier and an adder, said cells being selectively connectable to function as a cascade of first order polynomial dividers and as a cascade of first order polynomial multipliers, said registers being ordered in said cascade of first-order polynomial multipliers to function in opposite order from their respective order in the cascade of first-order polynomial dividers;

means for connecting said cells to function as said cascade of first order polynomial dividers;

means for sequentially inputting data symbols for a codeword to the cascade of first-order polynomial dividers;

means for connecting said cells to function as said cascade of first order polynomial multipliers; and, means for holding the input to said multiplier cascade to zero and clocking said resettable registers to clock out the redundancy symbols associated with the data symbols.

23. Apparatus for generating redundancy symbols during encoding of data symbols and for generating syndromes during decoding of codewords which may contain errors comprising the apparatus of claim 22 wherein each said cell is selectively connectable to function as a separate first order polynomial divider, and further comprising:

means for connecting each cell to form a separate first order polynomial divider; and, means for providing codewords that may have errors therein to the separate dividers to divide the received code word by the generating polynomial to generate the syndromes.

24. The apparatus of claim 22 wherein the register of a cell is held reset when the root of the cell is not to be included in the desired generator polynomial.

25. The apparatus of claim 22 wherein each cell is selectively connectable to function as said cascade of first order polynomial multipliers with said registers being ordered in said cascade of first-order polynomial multipliers to function in opposite order from their respective order in the cascade of first-order polynomial dividers by connecting said cells to function as said cascade of first-order polynomial dividers and applying the sum of the contents of said registers to the input of said cascade of first-order polynomial dividers.

26. A method of generating redundancy symbols during encoding of data symbols consisting of groups of binary bits into codewords of polynomial codes, each codeword c(x) being formed by dividing a data polynomial D(x) of degree less than k by a generator polynomial g(x) of degree n-k to obtain a redundancy polynomial r(x) of degree less than n-k, and appending r(x) to D(x) to yield c(x) of degree less than n, each symbol having a predetermined plurality of binary bits m, comprising:

providing a plurality of cells, each cell having a register, a finite field multiplier and an adder, said cells being selectively connectable to function as a cascade of first order polynomial dividers and as a cascade of first order polynomial multipliers, said registers being ordered in said cascade of first-order polynomial multipliers to function in opposite order from their respective order in the cascade of first-order polynomial dividers;

connecting said cells to function as said cascade of first order polynomial dividers;

sequentially inputting data symbols for a codeword to the cascade of first-order polynomial dividers;

connecting said cells to function as said cascade of first order polynomial multipliers, and, holding the input to said multiplier cascade to zero and clocking said resettable registers to clock out the redundancy symbols associated with the data symbols.

27. The method of generating redundancy symbols during encoding of data symbols and for generating syndromes during decoding of codewords which may contain errors comprising the apparatus of claim 26 wherein each said cell is selectively connectable to function as a separate first order polynomial divider, and further comprising:

connecting each cell to form a separate first order polynomial divider; and, providing codewords that may have errors therein to the separate dividers to divide the received code word by the generating polynomial to generate the syndromes.

28. The method of claim 26 wherein the register of a cell is held reset when the root of the cell is not to be included in the desired generator polynomial.

29. The method of claim 26 wherein each cell is selectively connectable to function as said cascade of first order polynomial multipliers with said registers being ordered in said cascade of first-order polynomial multipliers to function in opposite order from their respective order in the cascade of first-order polynomial dividers by connecting said cells to function as said cascade of first-order polynomial dividers and applying the sum of the contents of said registers to the input of said cascade of first-order polynomial dividers.

* * * * *

UNITED STATES PATENT AND TRADEMARK OFFICE
CERTIFICATE OF CORRECTION

PATENT NO. : 5,473,620
DATED : December 5, 1995
INVENTOR(S) : Zook et al

It is certified that error appears in the above-indentified patent and that said Letters Patent is hereby corrected as shown below:

In column 2, in the equation approximately at line 53, delete "+111" and insert -- $\Pi$ --.

In column 2, starting at line 64 and ending in column 3, at line 6, please delete the entire paragraph beginning "FIG. 3 shows a plurality of cells . . ." and ending with "are each m bit wide."

In column 3, at line 9, please delete "registear" and insert -- register --; also delete "$(A_j)$".

In column 3, at line 10, delete "$(r_j)$".

In column 3, lines 11 to 12, please delete ", where j=0, 1, 2, . . . , n-k-2, n-k-1".

UNITED STATES PATENT AND TRADEMARK OFFICE
CERTIFICATE OF CORRECTION

PATENT NO. : 5,473,620
DATED : December
INVENTOR(S) : Zook et al

It is certified that error appears in the above-indentified patent and that said Letters Patent is hereby corrected as shown below:

In column 3, lines 14 to 17, please delete "Each polynomial divider is made of a register $(B_j)$ $210_j$, a constant divider $(r_j)$ $211_j$ and an adder $212_j$, each one symbol wide, where j=0, 1, 2, . . . , n-k-2, n-k-1. The input to each divider is $213_j$, where t=0, 1, . . . , $213_{n-k}$."

In column 3, in the equation approximately at line 29, delete "+111" and insert -- $\Pi$ --.

In column 3, lines 56 and 61, please change "$102_j$" to -- 102 -- and change "$103_j$" to -- 103 --.

In column 3, lines 56 to 57, please delete "where j=0, 1, 2, . . . , n-k-2, n-k-1,".

Signed and Sealed this

Twenty-fourth Day of April, 2001

*Attest:*

NICHOLAS P. GODICI

*Attesting Officer*   *Acting Director of the United States Patent and Trademark Office*